(12) United States Patent
Chen et al.

(10) Patent No.: US 10,973,149 B2
(45) Date of Patent: Apr. 6, 2021

(54) STREAMLINED AIR BAFFLE FOR ELECTRONIC DEVICE

(71) Applicant: QUANTA COMPUTER INC., Taoyuan (TW)

(72) Inventors: Chao-Jung Chen, Taoyuan (TW); Yu-Nien Huang, Taoyuan (TW); Herman Tan, Taoyuan (TW); Chih-Wei Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/895,345

(22) Filed: Feb. 13, 2018

(65) Prior Publication Data

US 2019/0116689 A1 Apr. 18, 2019

Related U.S. Application Data

(60) Provisional application No. 62/571,875, filed on Oct. 13, 2017.

(51) Int. Cl.
*H05K 7/20* (2006.01)
*G06F 1/20* (2006.01)

(52) U.S. Cl.
CPC ........... *H05K 7/20145* (2013.01); *G06F 1/20* (2013.01); *H05K 7/20154* (2013.01); *H05K 7/20727* (2013.01)

(58) Field of Classification Search
CPC ... H05K 7/20145; H05K 7/20154; G06F 1/20
USPC .................................................. 361/679.47
See application file for complete search history.

(56) References Cited

U.S. PATENT DOCUMENTS

| | | | |
|---|---|---|---|
| 6,483,699 B1 | 11/2002 | Salmonson et al. | |
| 6,504,718 B2 | 1/2003 | Wu | |
| 6,597,569 B1* | 7/2003 | Unrein | G06F 1/181 361/679.4 |
| 6,678,157 B1 | 1/2004 | Bestwick | |
| 2008/0068796 A1* | 3/2008 | Pav | G06F 1/20 361/695 |

(Continued)

FOREIGN PATENT DOCUMENTS

| | | |
|---|---|---|
| CN | 201274631 Y | 7/2009 |
| CN | 102858137 A | 1/2013 |
| JP | 2009176845 A | 8/2009 |

(Continued)

OTHER PUBLICATIONS

TW Office Action for Application No. 107116324, dated Dec. 18, 2018, w/ First Office Action Summary.

(Continued)

*Primary Examiner* — Anatoly Vortman
*Assistant Examiner* — Zhengfu J Feng
(74) *Attorney, Agent, or Firm* — Nixon Peabody LLP

(57) ABSTRACT

A streamlined air baffle for efficiently directing air flow from a fan unit to a heat sink is disclosed. The streamlined air baffle has a top cover plate and a pair of side walls. The side walls are connected to the top cover plate. The top cover plate and one end of the side walls define an inlet. A curved surface of the top cover plate defines the outlet with the opposite ends of the side walls. The cross section area of the outlet is smaller than the cross section area of the inlet.

14 Claims, 5 Drawing Sheets

(56) References Cited

U.S. PATENT DOCUMENTS

2008/0239661 A1* 10/2008 McClellan ......... H05K 7/20154
                                                                 361/690
2018/0158748 A1* 6/2018 Kwon ................. H01L 23/3675

FOREIGN PATENT DOCUMENTS

| TW | M282240 U | 12/2005 |
|----|-----------|---------|
| TW | I450681 B | 8/2014  |

OTHER PUBLICATIONS

TW Search Report for Application No. 107116324, dated Dec. 18, 2018, w/ First Office Action.
Extended European Search Report for EP Application No. 18183188.4, dated Feb. 18, 2019.
JP Office Action for Application No. 2018-156252, dated Oct. 1, 2019, w/ First Office Action Summary.

\* cited by examiner

STREAMLINED AIR BAFFLE FOR ELECTRONIC DEVICE

PRIORITY CLAIM

The present application claims priority to U.S. Provisional Application No. 62/571,875, filed on Oct. 13, 2017. The entirety of that application is hereby incorporated by reference.

TECHNICAL FIELD

The present disclosure relates generally to a streamlined air baffle. More particularly, aspects of this disclosure relate to a streamlined air baffle suitable for efficiently directing air flow to a heat sink in an electronic device such as a network server blade.

BACKGROUND

Distributed network systems have been widely adopted with the emergence of the cloud for computing applications. Network systems encompass numerous connected devices including servers, switches, and other devices that exchange data. Faster and denser electronic components have been used in network devices to address the need for increased data capability and speed.

Network devices such as servers generate an enormous amount of heat due to the operation of internal electronic devices such as transceivers, controllers, processors, and memory. Overheating from the inefficient removal of such heat has the potential to shut down or impede the operation of such devices. Thus, network system devices, such as servers, are designed to rely on air flow through the interior of the system device to carry away heat generated from electronic components. Such devices often include various heat sinks that are attached to the electronic components. Heat sinks are typically composed of thermally conductive material. Heat sinks absorb the heat from the electronic components, thus transferring the heat away from the components. Airflow is often generated by a fan system that accelerates airflow through the system device and the heat sink. The generated airflow thus carries collected heat away from the heat sink and out of the device. The generated air flow is most efficiently utilized if it is largely focused toward the heat sink and not dissipated throughout the rest of the system device. Thus, a mechanism to assist in focusing air flow from a fan to a heat sink is an air baffle. An air baffle directs the air flow from the fan system toward a heat sink, and contains the air flow so it does not dissipate to other areas of the device. An air baffle is a physical enclosed structure having walls that channel airflow from the fan to the heat sink. It is desirable to maximize heat sink and air flow efficiency to minimize the power necessary to operate cooling fans in such system devices.

Thus, an air baffle is a necessary part in an electronic system device to maintain the airflow in the system device. An air baffle can help such a system device achieve high efficiency airflow that may lead to lower cooling power use, as compared to a system device without an air baffle.

However, care must be taken in designing the shape of an air baffle for an electronic system device. A badly designed air baffle may result in a large pressure drop, caused by air turbulence inside the system device. The large pressure drop may require greater cooling power to achieve the minimum air flow rate to cool the components of the system device. Thus, a well-designed air baffle will result in smooth air flow while maintaining the flow direction to minimize undesirable pressure drops.

Thus, there is a need for an air baffle that minimizes air flow turbulence via an aerodynamic shape. There is a further need for an air baffle that has a shape that maximizes air flow to minimize power for cooling. There is also a need for an air baffle that allows a secondary air flow to cool other components.

SUMMARY

One disclosed example is an air baffle for directing air flow to a heat sink, where the air baffle includes a top cover plate and a pair of side walls. The side walls are connected to the top cover plate. The top cover plate and one end of the side walls define an inlet. A curved surface of the top cover plate is connected to the side walls. The opposite ends of the side walls and the curved surface define an outlet. The cross section area of the outlet is smaller than the cross section area of the inlet.

Another disclosed example is an electronic device having a chassis that mounts an electronic component. A fan housing is located on the chassis. A heat sink is in thermal contact with the electronic component on the chassis. An air baffle is mounted between the fan housing and the heat sink. The air baffle includes a top cover plate, a pair of side walls, and a curved surface of the top cover plate. The side walls are connected to the top cover plate. The top cover plate and one end of the side walls define an inlet. The curved surface and the opposite ends of the side walls define an outlet. The cross section area of the outlet is smaller than the cross section area of the inlet.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1:
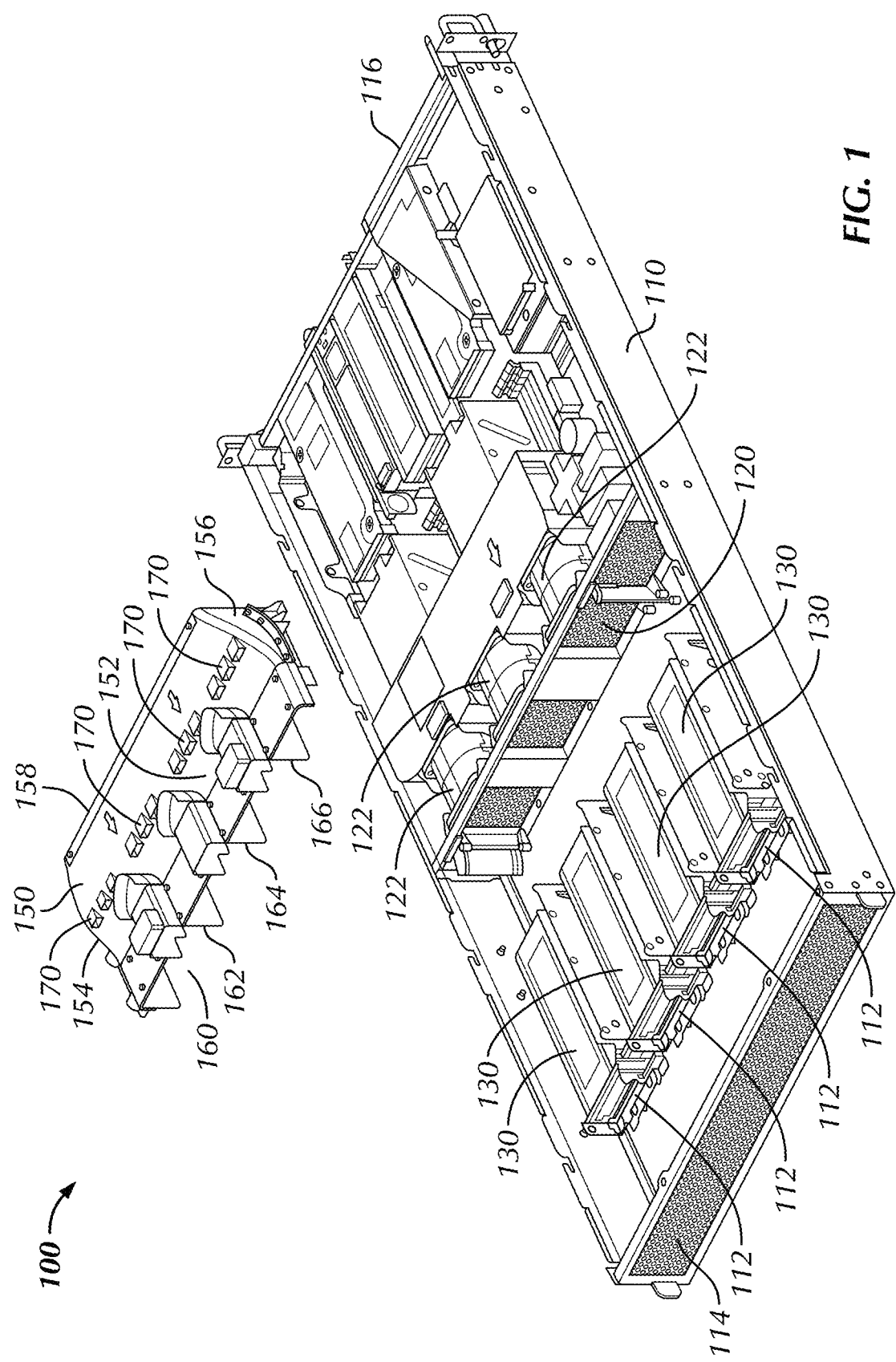
FIG. 1 is a perspective view of an example network device with a streamlined air baffle.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections—but not explicitly set forth in the claims—should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at, near, or nearly at," or "within 3-5% of," or "within acceptable manufacturing tolerances," or any logical combination thereof, for example.

FIG. 1 shows a perspective view of an electronic device 100 that may be a server blade in this example. The electronic device 100 includes a chassis 110 that holds different electronic components 112. In this example, there are four slots that hold respective electronic components 112. The electronic device 100 includes a front end 114 and an opposite back end 116. The back end 116 includes different connection interfaces to allow electronic communication with the electronic components.

A fan wall 120 is located behind the electronic components 112. The fan wall 120 includes individual fan units 122 that are controlled by a baseboard management controller. The baseboard management controller may be coupled to heat sensors to determine the temperature of the electronic components 112. Each fan unit 122 includes a motor and fan that generate air flow from the back end 116 of the electronic device 100 to the front end 114. Fan power is regulated to increase the speed of the motor of the fan units 122 when more cooling is required as indicated by the sensors. The fan wall 120 is in proximity to heat sinks 130 that are each installed on top of the electronic components 112. The heat sinks 130 absorb heat from the electronic components and are located in the path of generated air flow.

FIG. 1 shows an air baffle 150 that encloses the heat sinks 130. In this view, the air baffle 150 is removed from the electronic device 100 for illustration purposes. The air baffle 150 has a cover plate 152 and two side walls 154 and 156. The cover plate 152 and side walls 154 and 156 form an open front end 158, and an open rear end 160. The forward cross section of the open front end 158 of the air baffle 150 has a shape that is consistent with the cross section of the fan wall 120. The air baffle 150 includes interior vanes 162, 164, and 166 attached to the underside of the cover plate 152. The interior vanes 162, 164, and 166 channel air flow to the individual heat sinks 130 and corresponding electronic components 112. Thus, the side walls 154 and 156, and the interior vanes 162, 164, and 166 form four separate interior channels that guide air flow to each of the four electronic components 112 and their respective heat sinks 130. The four channels are shaped by the curvature of the cover plate 152. A series of air scoops 170 are cut into the cover plate 152 relative to each of the four channels. As will be explained below, the air scoops 170 serve to reduce air turbulence in order to maximize air flow.

When the air baffle 150 is installed, it guides air flow from the fan units 122 of the fan wall 120 toward the electronic components 112 and the heat sinks 130. As may be seen in the close up views, the side walls 154 and 156 overlap the fan units 122. Thus, most of the air flow generated by the fan wall 120 is directed through the air baffle 150. The air baffle 150 is mounted in line between the fan wall 120 and the electronic components 112. The air flow generated from the fans of the fan wall 120 is thus directed by the air baffle 150 toward the heat sinks 130. The air flow is then forced out from the open rear end 160 of the baffle 150 over the heat sinks 112 to the front end 114 of the electronic device 100. As may be seen in FIG. 1, the fan wall 120 has a greater height than the combined electronic components 112 and the heat sinks 130. The cross sectional area of the open front end 158 of the air baffle 150 therefore differs from cross sectional area of the open rear end 160 because the height of the open rear end 160 is matched to the height of the electronic components 112 and their respective attached heat sinks 130. In this example, the cross sectional area of the open rear end 160 is approximately the cross section area of the heat sinks 130. The differing cross sectional areas of the open front end 158 and open rear end 160 ensure the airflow generated by the fan wall 120 is directed entirely toward the heat sinks 130 to maximize cooling efficiency. The difference in heights from the open front end 158 to the open rear end 160 may create air flow turbulence and resulting pressure drops that are minimized by the shape of the air baffle 150.

Figure 2:
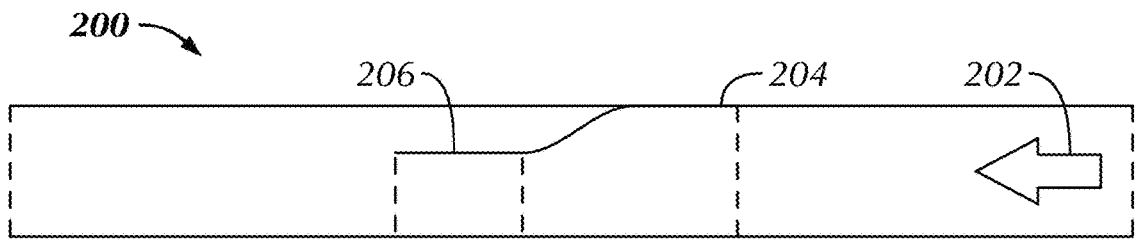
FIG. 2 is a side view of a virtual wind tunnel used to evaluate the example air baffle in FIG. 1 to allow efficient air flow.

FIG. 2 is a diagram of a virtual wind tunnel 200 used to test different shapes for the air baffle 150 in FIG. 1. The air baffle designs described below are presented as a case study using the virtual wind tunnel 200 to simulate a streamlined airflow 202, with the presence of a test air baffle 204 to maintain all or most of the airflow through a resistance. The resistance is a heat sink 206 in this example. The streamlined airflow 202 flows from right side of FIG. 2, and enters the test air baffle 204 before it is directed through the heat sink 206. In this manner, the virtual wind tunnel 200 may model the turbulence created by the test air baffle 204, and the pressure generated by the air flow for each of the proposed baffle designs may be analyzed.

Figure 3A:
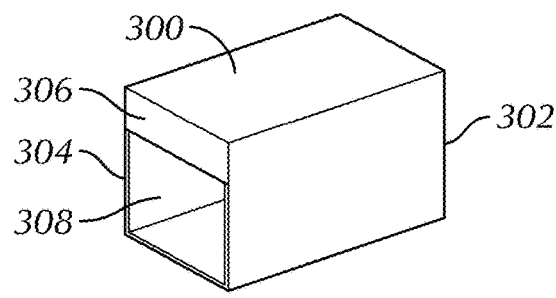
FIGS. 3A-3D are perspective views of different air baffle design shapes.

FIGS. 3A-3D are perspective views of different air baffle designs that are evaluated as the test air baffle 204 in the virtual wind tunnel in FIG. 2. Each of the air baffle designs shown in FIGS. 3A-3D correspond to one of the interior channels created by the side walls 154 and 156, and the interior vanes 162, 164, and 166 in FIG. 1. FIG. 3A shows an air baffle design 300 having an inlet side 302 with a rectangular cross section area matching a fan wall cross section area. The air baffle design 300 has an opposite outlet side 304 having a simple flat barrier 306 that forms an open cross section area 308, that matches the cross section area of the heat sink 206 in FIG. 2. The outlet cross section area 308 is smaller than the cross section area of the inlet side 302. The air baffle 300 is modeled by the virtual wind tunnel 200 in FIG. 2 to determine the effects of the flat barrier 306, to force the incoming airflow to flow through the heat sink 206 facing the outlet side 304 of the baffle 300.

Figure 3B:
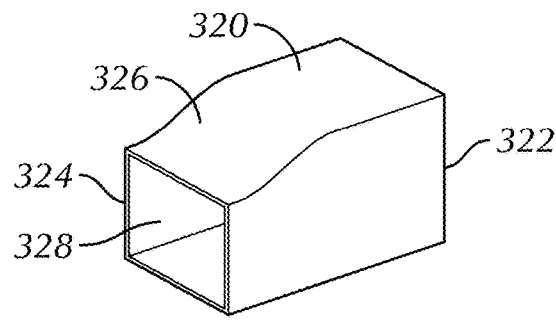

FIG. 3B shows an air baffle design 320 having an inlet side 322 with a rectangular cross section area matching a fan wall cross section area. The air baffle design 320 has an opposite outlet side 324 having an aerodynamic surface 326 that has a curvature to form an open cross section area 328, that matches the cross section area of the heat sink 206 in FIG. 2. The outlet cross section area 328 is smaller than the cross section area of the inlet side 322. The air baffle 320 is modeled with the curvature of the surface 326, intended to guide the incoming airflow to smoothly flow into the heat sink 206 in FIG. 2 through the cross section area 328. The range of the curvature of the surface 326 may be selected depending on the air speed generated by the fans. The degree of the curvature may be tuned by using computational fluid dynamics (CFD) to find an optimized design with air speed from the fans as an input.

Figure 3C:
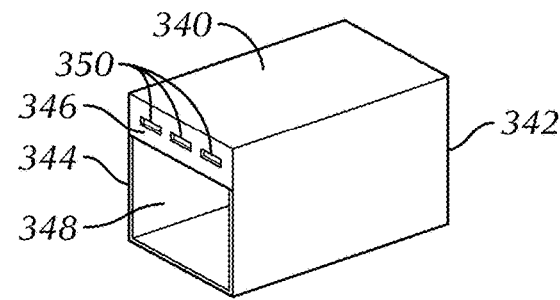

FIG. 3C shows an air baffle design 340 having an inlet side 342 with a rectangular cross section area matching a fan wall cross section area. The air baffle design 340 has an opposite outlet side 344 having a simple flat barrier 346 that forms an open cross section area 348, that matches the cross section area of the heat sink 206 in FIG. 2. The outlet cross section area 348 is smaller than the cross section area of the inlet side 342. The air baffle design 340 siphons a minor amount of the air flow to pass over the heat sink 206 to cool another component. Thus, three rectangular openings 350 are cut into the barrier 346 to facilitate the supplemental cooling of another component through a secondary air flow.

Figure 3D:
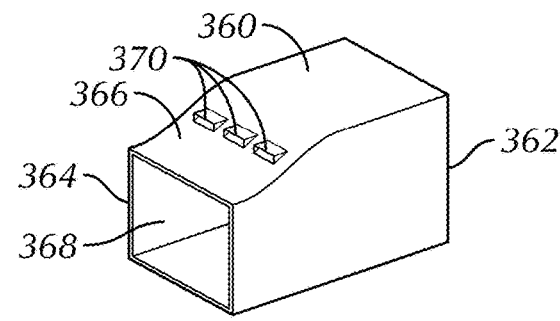

FIG. 3D shows an air baffle design 360 having an inlet side 362 with a rectangular cross section area matching the fan wall cross section area. The air baffle design 360 has an opposite outlet side 364 having an aerodynamically curved surface 366 that forms an open cross section area 368, that matches the cross section area of the heat sink 206 in FIG. 2. The outlet cross section area 368 is smaller than the cross section area of the inlet side 362. The air baffle design 360 is designed to siphon a minor amount of air flow to pass over the heat sink 206 to cool another component. Thus, three scoops 370 are cut into the surface 366 to facilitate supplemental cooling of another component. The scoops 370 each have the same opening dimensions as the openings 350 in FIG. 3C.

Figure 4A:
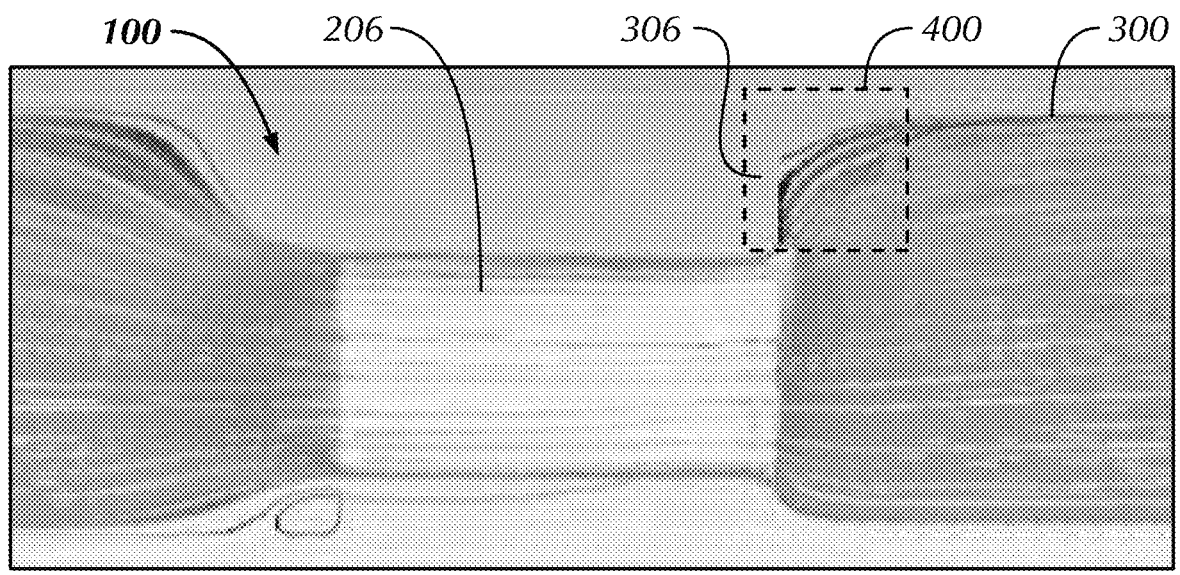
FIGS. 4A-4D are air flow patterns based on the different air baffle design shapes in FIGS. 3A-3D tested in the virtual wind tunnel in FIG. 2.

FIGS. 4A-4D are diagrams of air flows through the virtual wind tunnel 200 in FIG. 2, as based on different air baffle designs 300, 320, 340, and 360 shown in FIGS. 3A-3D respectively. FIG. 4A shows the air flow directed toward the heat sink 206 using the air baffle design 300 in FIG. 3A. The airflow pattern for the air baffle 300 shows there is a sudden air path change 400 at the location of the flat barrier 306. The sudden air path change 400 is a drawback since it causes unintended high local pressure, and will degrade overall airflow through the baffle 300.

Figure 4B:
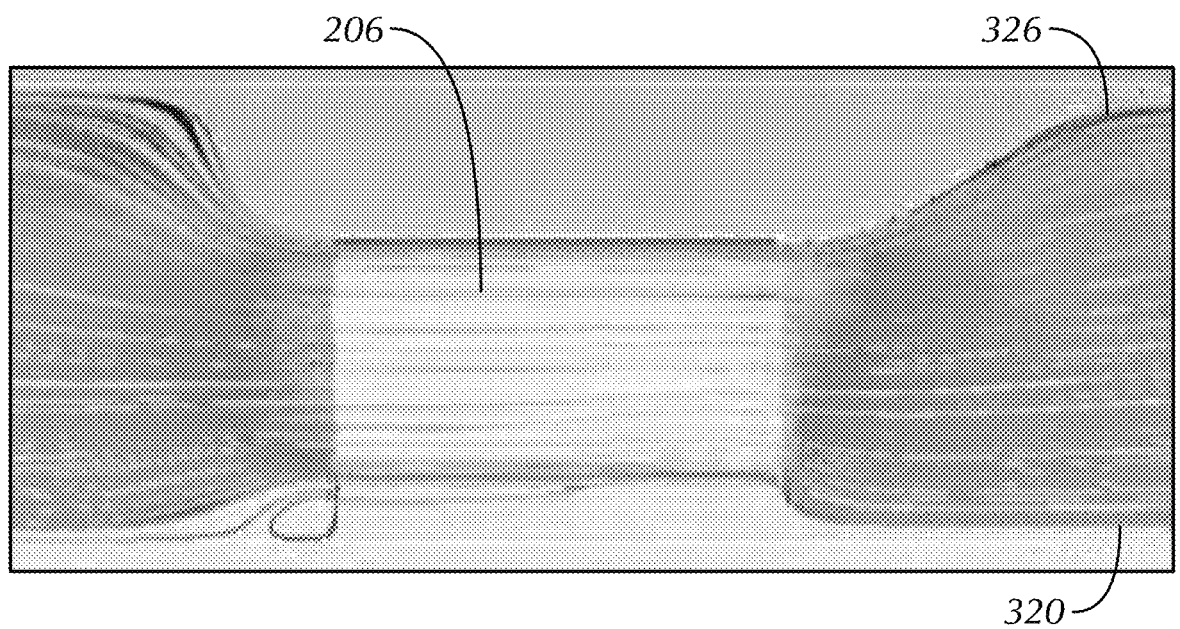

FIG. 4B shows the air flow directed toward the heat sink 206 using the air baffle design 320 in FIG. 3B. The addition of the streamlined curved surface 326 of the air baffle 320 results in no sudden air path changes in the airflow pattern. The design 320 therefore eliminates the unintended local high pressure shown in FIG. 4A.

Figure 4C:
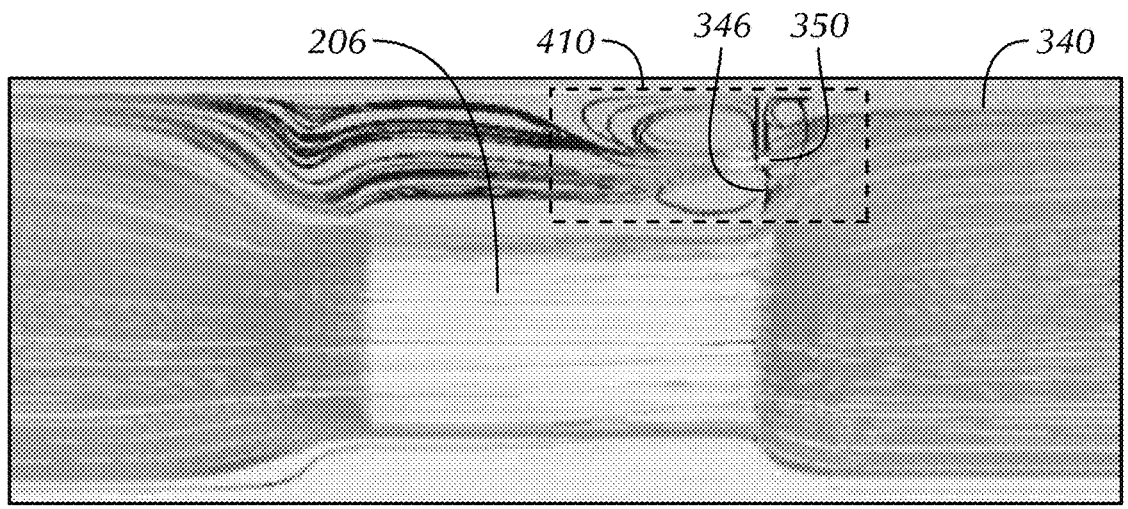

FIG. 4C shows the air flow directed toward the heat sink 206 using the air baffle design 340 in FIG. 3C. The airflow pattern for the air baffle 340 shows there is an area 410 where multiple turbulences or vortexes occur from the opening 350 in the barrier 346. The multiple turbulences degrade the overall airflow.

Figure 4D:
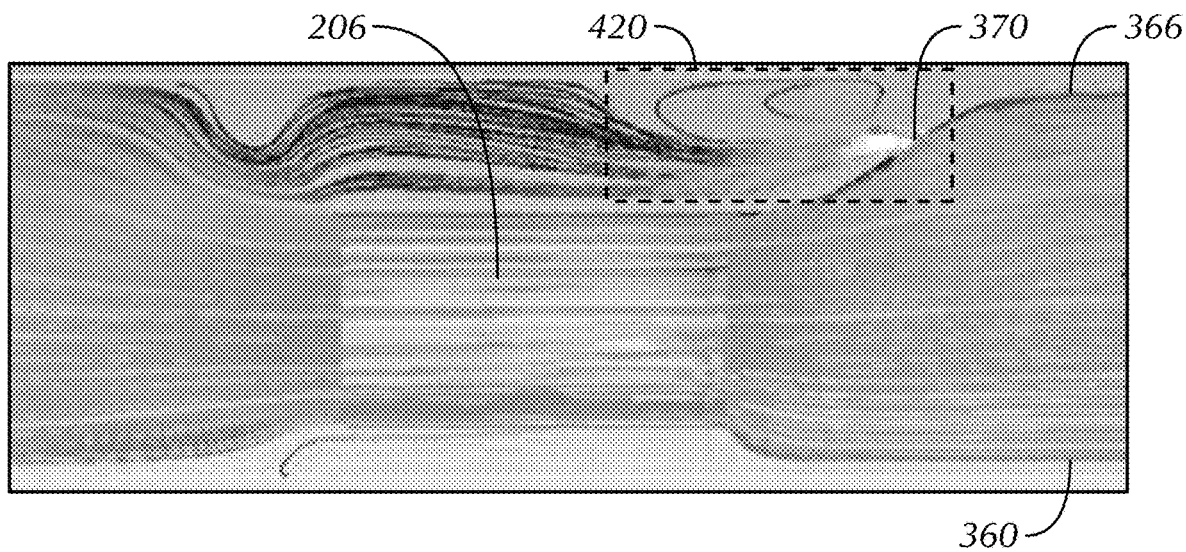

FIG. 4D shows the air flow directed toward the heat sink 206 using the air baffle design 360 in FIG. 3D. The airflow pattern in an area 420 for the supplemental airflow created by the scoop 370 in the curved surface 366 of the air baffle 360 shows that this design minimizes the turbulence of the secondary air flow, as compared to the area 410 shown in FIG. 4C.

Figure 5:
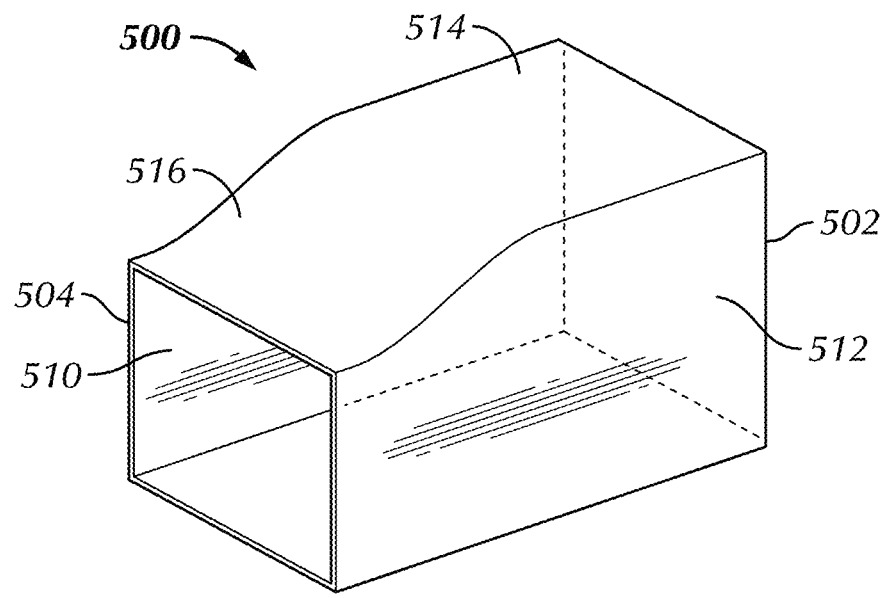
FIG. 5 is a perspective view of an example air baffle having an aerodynamic shape.

FIG. 5 is a perspective view of an air baffle 500 that incorporates the air baffle design 320 shown in FIG. 3B. The air baffle 500 has an inlet 502 and an opposite outlet 504. The air baffle 500 is formed by two side walls 510 and 512 and a top cover plate 514. The side walls 510 and 512 are connected to the top cover plate 514. The top cover plate 514 and one end of the side walls 510 and 512 define the inlet 502. The cross section area of the inlet 502 matches the cross section area of a fan unit such as the fan unit 122 in FIG. 1 in this example. The cross section of the inlet 502 may be expanded in width to match the cross section area of a fan wall with multiple fan units. The ends of the side walls 510 and 512 and the end of the top cover plate 514 may be extended to overlap a fan housing, such as the fan wall 120 in FIG. 1. The overlap ensures that the air flow generated by the fan wall is directed into the air baffle 500.

The opposite ends of the side walls 510 and 512 define the outlet 504, along with one end of a curved surface 516. The outlet 504 has a smaller cross section area than the cross section area of the inlet 502 to direct air flow to an area directly surrounding a heat sink, such as the heat sink 130 in FIG. 1. The smaller cross section area of the outlet 504 is formed by the curved aerodynamic surface 516 that guides the airflow without interrupting airflow to the smaller outlet 504. The curved aerodynamic surface 516 has one end at the same height as the inlet 502 and slopes down to the height of the outlet 504. In this manner, the air baffle 500 directs airflow to a heat sink while minimizing turbulence and high pressure.

The air baffle 500 is installed on a mounting surface between a fan wall and a heat sink. The ends of the side walls 510 and 512, and end of the cover plate 514 that form the inlet 502, overlap the fan wall to insure that the entire air flow from the fan wall is directed into the air baffle. The length of the air baffle 500 is consistent with the distance between the fan wall and the heat sink. The cross section area of the outlet 504 is consistent with the cross section area of a heat sink and thus maximum air flow is directed toward the heat sink.

Figure 6:
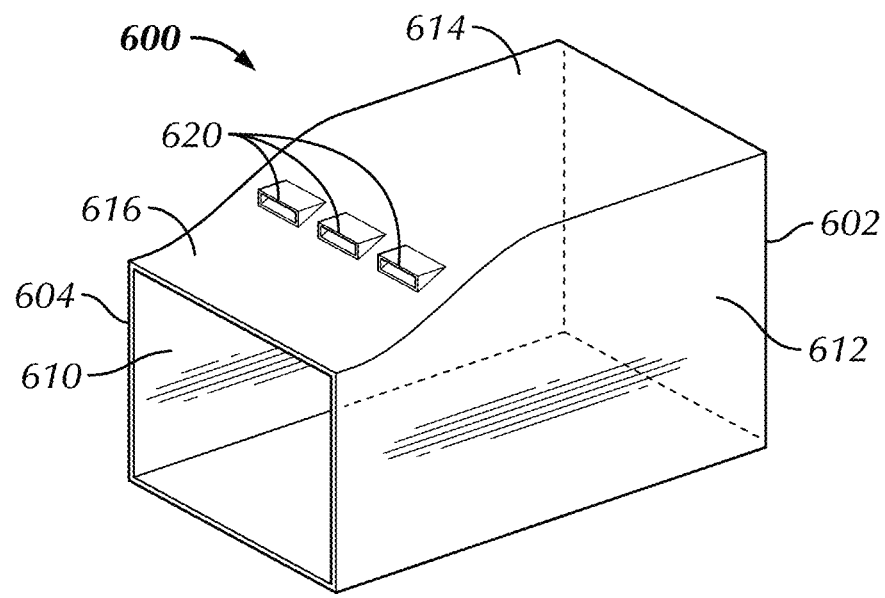
FIG. 6 is a perspective view of another example air baffle having an aerodynamic shape and allowing secondary airflow.

FIG. 6 is a perspective view of an air baffle 600 that incorporates the air baffle design 360 shown in FIG. 3D. The air baffle 600 has an inlet 602 and an opposite outlet 604. The air baffle 500 is formed by two side walls 610 and 612 and a cover plate 614. The cross section area of the inlet 602 matches the cross section area of a fan unit in this example. The cross section area of the inlet 602 may be expanded in width to match the cross section area of a fan wall with multiple fan units. The outlet 604 has a smaller cross section area than that of the inlet 502 to direct air flow to an area directly surrounding a heat sink. The outlet 604 is formed by a curved aerodynamic surface 616 that guides the airflow without interrupting airflow to the smaller outlet 604. The curved aerodynamic surface 616 has one end at the same height as the inlet 602, and slopes down to the height of the outlet 604. In this manner, the air baffle 600 directs airflow to a heat sink while minimizing high pressure and turbulence.

The air baffle 600 is installed on a mounting surface between a fan wall and a heat sink. The ends of the side walls 610 and 612, and end of the cover plate 614 that form the inlet 602, overlap the fan wall to insure that the entire air flow from the fan wall is directed into the air baffle. The length of the air baffle 600 is consistent with the distance between the fan wall and the heat sink. The cross section area of the outlet 604 is consistent with the cross section area of a heat sink, and thus maximum air flow is directed toward the heat sink.

The air baffle 600 allows secondary air flow to be diverted from the heat sink. The secondary air flow may be used to cool other components. A series of three scoops 620 are located on the curved surface 616. The scoops 620 allow some air flow from the enclosure of the air baffle 600 to be directed away from the heat sink. The air flow that travels through the scoops 620 provides the secondary cooling air flow.

It is to be understood that the example disclosed air baffle could be modified to completely or partially over the heat sink structures. Further the height between the front and rear openings could be adjusted to be the same or different heights. The side walls and interior vanes of the baffle may also have different shapes such as a curved shape to smooth airflow.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

Computing devices typically include a variety of media, which can include computer-readable storage media and/or communications media, in which these two terms are used herein differently from one another as follows. Computer-readable storage media can be any available storage media that can be accessed by the computer; is typically of a non-transitory nature; and can include both volatile and nonvolatile media, removable, and non-removable media. By way of example, and not limitation, computer-readable storage media can be implemented in connection with any method or technology for storage of information, such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media that can be used to store desired information. Computer-readable storage media can be accessed by one or more local or remote computing devices, e.g., via access requests, queries, or other data retrieval protocols, for a variety of operations with respect to the information stored by the medium.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An air baffle for directing air flow to a heat sink, the air baffle comprising:
    a top cover plate defined by a convex portion and a concave portion;
    a pair of side walls, the side walls connected to the top cover plate, a portion of the concave portion of the top cover plate and one end of the side walls defining an inlet; opposite ends of the side walls and a portion of the convex portion of the top cover plate defining an outlet; and
    one or more interior vanes coupled to the top cover plate and spaced apart from the pair of side walls, the one or more interior vanes defining a plurality of interior channels extending from the inlet to the outlet, wherein each channel of the plurality of interior channels comprises a plurality of air scoops positioned between the convex portion and the concave portion, wherein the plurality of air scoops divert air flow from the outlet to reduce air turbulence within the channel of the plurality of interior channels.

2. The air baffle of claim 1, wherein a cross-sectional area of the channel of the plurality of interior channels at the inlet matches a cross-sectional area of a fan unit.

3. The air baffle of claim 1, wherein a cross-sectional area of the channel of the plurality of interior channels at the outlet approximately similar to a cross-sectional area of a heat sink.

4. The air baffle of claim 1, wherein the length of the side walls is approximately the same as a distance between a fan unit and the heat sink.

5. The air baffle of claim 1, wherein the width between the side walls are approximately the width of a fan wall having multiple fan units.

6. The air baffle of claim 5, wherein the ends of the side walls are configured to overlap the fan wall.

7. An electronic device, comprising:
a chassis mounting a plurality of electronic components;
a fan housing on the chassis;
a plurality of heat sinks in thermal contact with the plurality of electronic components on the chassis; and
an air baffle mounted between the fan housing and the plurality of heat sinks, the air baffle including a top cover plate defined by a convex portion and a concave portion, a pair of side walls, and one or more interior vanes coupled to the top cover plate and spaced apart from the pair of side walls, the one or more interior vanes defining a plurality of interior channels extending from an inlet to an outlet, wherein each channel of the plurality of interior channels comprises a plurality of air scoops positioned between the convex portion and the concave portion, wherein:
the side walls are connected to the top cover plate,
a portion of the concave portion of the top cover plate and one end of the side walls define the inlet,
a portion of the convex portion of the top cover plate and the opposite ends of the side walls define the outlet, and
the plurality of air scoops divert air flow from the outlet to reduce air turbulence within the channel of the plurality of interior channels.

8. The electronic device of claim 7, wherein a cross-sectional area of the inlet matches a cross-sectional area of the fan housing.

9. The electronic device of claim 7, wherein a cross-sectional area of each channel of the plurality of interior channels at the outlet is approximately similar to a cross-sectional area of a respective one of the plurality of heat sinks.

10. The electronic device of claim 7, wherein the length of the side walls is approximately the same as a distance between the fan housing and the plurality of heat sinks.

11. The electronic device of claim 7, wherein the fan housing includes multiple fan units.

12. The electronic device of claim 7, wherein the ends of the side walls are configured to overlap the fan housing.

13. The air baffle of claim 1, wherein a cross-sectional area of the outlet is smaller than a cross-sectional area of the inlet.

14. The electronic device of claim 7, wherein a cross-sectional area of the outlet is smaller than a cross-sectional area of the inlet.

* * * * *